United States Patent
Moschini

[11] Patent Number: 6,054,688
[45] Date of Patent: Apr. 25, 2000

[54] HYBRID HEATER WITH CERAMIC FOIL SERRATED PLATE AND GAS ASSIST

[75] Inventor: Lawrence R. Moschini, Carlisle, Mass.

[73] Assignee: Brooks Automation, Inc., Chelmsford, Mass.

[21] Appl. No.: 09/280,751

[22] Filed: Mar. 29, 1999

Related U.S. Application Data

[63] Continuation-in-part of application No. 08/882,367, Jun. 25, 1997, Pat. No. 5,911,896.

[51] Int. Cl.[7] ...................................................... H05B 1/02
[52] U.S. Cl. .................... 219/494; 219/483; 219/121.43; 438/660; 438/663; 118/725
[58] Field of Search ................................ 219/497, 121.4, 219/121.43, 121.41, 483–486, 390; 438/660, 663; 118/724, 725; 156/345

[56] References Cited

U.S. PATENT DOCUMENTS

| | | | |
|---|---|---|---|
| 4,715,921 | 12/1987 | Maher et al. ............................ | 156/345 |
| 4,903,754 | 2/1990 | Hirscher et al. ......................... | 165/29 |
| 4,919,614 | 4/1990 | Kitagawa et al. ....................... | 432/259 |
| 5,013,385 | 5/1991 | Maher et al. ............................ | 156/345 |
| 5,588,827 | 12/1996 | Muka ......................................... | 432/5 |
| 5,688,331 | 11/1997 | Aruga et al. ............................. | 118/725 |
| 5,892,207 | 4/1999 | Kawamura et al. .................... | 219/492 |
| 5,911,896 | 6/1999 | Holden et al. ........................... | 219/390 |

FOREIGN PATENT DOCUMENTS

95/16800   6/1995   WIPO .

Primary Examiner—Mark Paschall
Attorney, Agent, or Firm—Perman & Green, LLP

[57] ABSTRACT

A substrate heating apparatus having a chamber, a device for adding gas into the chamber and a substrate heater is provided. The substrate heater is located within the chamber and includes a first plate having a bottom surface. The bottom surface of the first plate has at least one groove. The at least one groove forms at least two thermal zones on the first plate. The substrate heater further includes a heater element and a second plate. The heater element is located between the bottom surface of the first plate and the second plate and thus enables heating of the substrate by radiation and gas conduction.

21 Claims, 6 Drawing Sheets

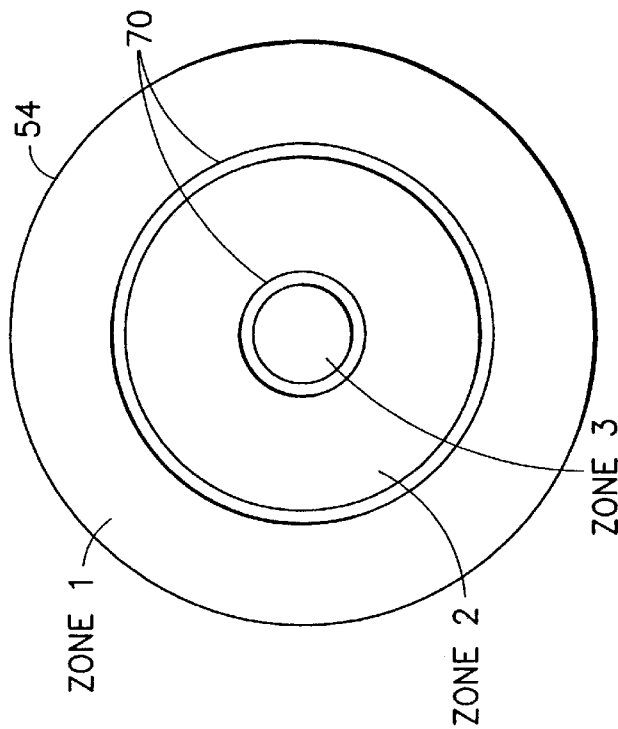
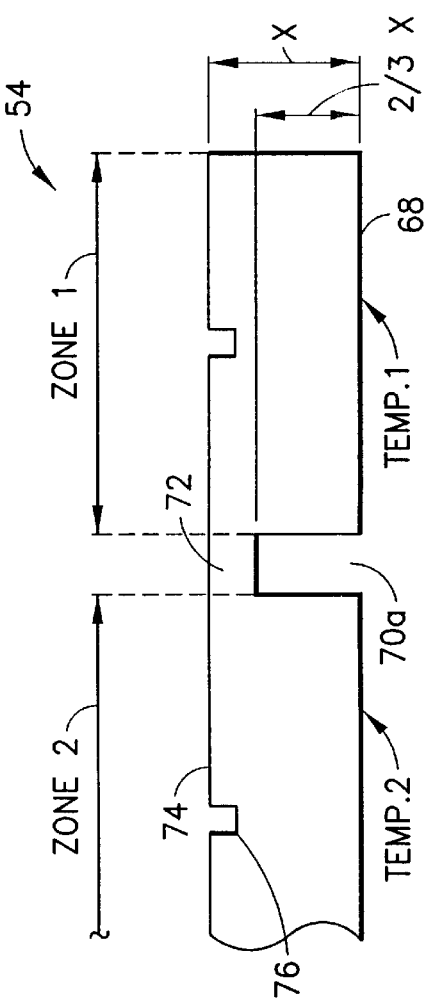

HYBRID HEATER WITH CERAMIC FOIL SERRATED PLATE AND GAS ASSIST

CROSS-REFERENCE TO RELATED APPLICATION

This is a continuation-in-part application of U.S. application Ser. No. 08/882,367 filed Jun. 25, 1997, now U.S. Pat. No. 5,911,896.

BACKGROUND OF THE INVENTION

1. Field of the Invention

The present invention relates to a substrate heating apparatus and, more particularly, to a heater used in a substrate heating apparatus.

2. Prior Art

U.S. Pat. No. : 4,903,754 discloses a heating plate with winding heating wires. U.S. Pat. No. : 4,919,614 discloses a heater in a heat transmitting member. U.S. Pat. No. : 5,588,827 discloses a heater plate with grooves for distribution of gas during heating. PCT Patent Publication No.: WO 95/16800 discloses lamp heaters.

SUMMARY OF THE INVENTION

In accordance with one embodiment of the present invention, a substrate heating apparatus for heating a substrate is provided comprising a chamber, a device for adding gas into the chamber and a substrate heater. The substrate heater is located within the chamber and includes a first plate having a bottom surface. The bottom surface of the first plate has at least one groove. The at least one groove forms at least two thermal zones on the first plate. In one embodiment, the at least one groove is a plurality of grooves that form a plurality of thermal zones on the first plate. The substrate heater further includes a heater element and a second plate. The heater element is located between the bottom surface of the first plate and the second plate and thus enables heating of the substrate by radiation and gas conduction.

In accordance with another embodiment of the present invention, a substrate heater for heating a substrate is provided which includes a heater plate and a heater element. The heater plate has a surface with at least one groove. The at least one groove is suitably sized and located so as to divide the heater plate into at least two separate thermal zones. The heater element has a plurality of distinct and different heat generation zones. The plurality of distinct and different heat generation zones providing different levels of heat generation across the heater element. The heater plate is located in close proximity to the heater element so that the separate thermal zones of the heater plate and the plurality of distinct and different heat generation zones of the heater element cooperate to provide zones in which different rates of heat transfer between the heater plate and the substrate can occur. As a result of exposure to the different rates of heat transfer, the substrate will reach set-point temperature uniformly across it surface.

In accordance with one method of the present invention, a method is provided for heating a substrate in a substrate heating apparatus. The method includes the steps of: positioning the substrate in a chamber of the substrate heating apparatus above a heater, the heater is comprised of a top plate having a bottom surface, the bottom surface has at least one groove which forms at least two thermal zones; heating the substrate from the at least two thermal zones of the top plate only by radiation heating; and after the substrate has obtained a predetermined temperature from the radiation heating, adding gas into the chamber such that heat is transferred from the at least two thermal zones of the top plate to the substrate by gas conduction.

In accordance with another method of the present invention, a method is provided for heating a substrate in a substrate heating apparatus. The method includes the steps of: positioning the substrate in a chamber of the substrate heating apparatus in close proximity to a heater; heating the substrate from heat radiated from the heater; adding gas into the chamber such that heat is transferred from the heater to the substrate by gas conduction; at a predetermined point in the heating of the substrate, removing the gas from the chamber; and maintaining the substrate at a predetermined temperature only from the radiation heating radiated from the heater. In one embodiment, the predetermined point in the heating of the substrate is a point in which a predetermined temperature is measured in the chamber. In another embodiment, the predetermined point in the heating of the substrate is a point in which a predetermined time period, measured from the start of the heating process, elapses.

In accordance with another method of the present invention, a method is provided for heating a substrate in a substrate heating apparatus. The method includes the steps of: positioning the substrate in a chamber of the substrate heating apparatus in close proximity to a heater; heating the substrate from heat radiated from the heater; and controlling the addition of gas into the chamber for transferring heat between the substrate and the heater by gas conduction; wherein the step of controlling adds the gas gradually into the chamber wherein a heat transfer rate between the substrate and the heater is increased gradually as more gas is added into the chamber.

BRIEF DESCRIPTION OF THE DRAWINGS

The foregoing aspects and other features of the invention are explained in the following description, taken in connection with the accompanying drawings, wherein:

FIG. 5 is a schematic cross-sectional, enlarged partial view of a heater plate of the substrate heating assembly shown in FIG. 4;

FIG. 6 is a schematic bottom view of the heater plate shown in FIGS. 4 and 5;

FIG. 7b is a schematic bottom view of the heater plate shown in FIG. 7a; and

Identically labeled elements appearing in different ones of the above described figures refer to the same elements, but may not be referenced in the description for all figures.

DETAILED DESCRIPTION OF THE INVENTION

Figure 1:
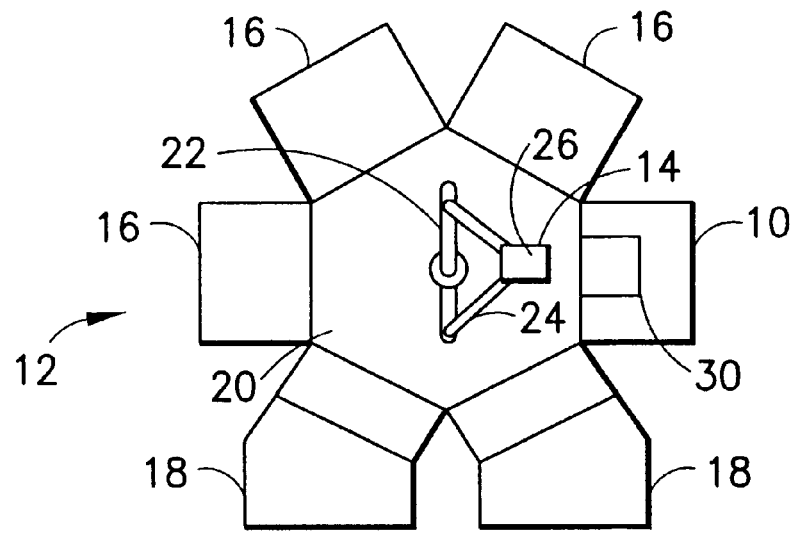
FIG. 1 is a schematic top plan view of a substrate processing apparatus having a substrate heating apparatus incorporating features of the present invention.

FIG. 1 shows a schematic top plan view of a substrate processing apparatus 12 having a substrate heating apparatus 10 incorporating features of the present invention. Although the present invention will be described with reference to the embodiments shown in the drawings, it should be understood that the present invention may be embodied in many forms of alternative embodiments. In addition, any suitable size, shape or type of materials or elements could be used.

The substrate heating apparatus 10 is part of the processing apparatus 12. The substrate processing apparatus 12 also includes a substrate transport apparatus 14, multiple processing chambers 16, substrate cassette load locks 18 and a central, transport chamber 20. An example of a substrate processing apparatus can be seen in U.S. Pat. No. : 4,715,921 which is hereby incorporated by reference in its entirety. The substrate transport apparatus 14 is adapted to transport planar substrates, such as semiconductor wafers or flat panel display substrates, between and/or among the processing chambers 16, the load locks 18 and the substrate heating apparatus 10. PCT Patent Publication No.: WO 94/23911 discloses a similar substrate transport apparatus which is hereby incorporated by reference in its entirety.

Figure 2:
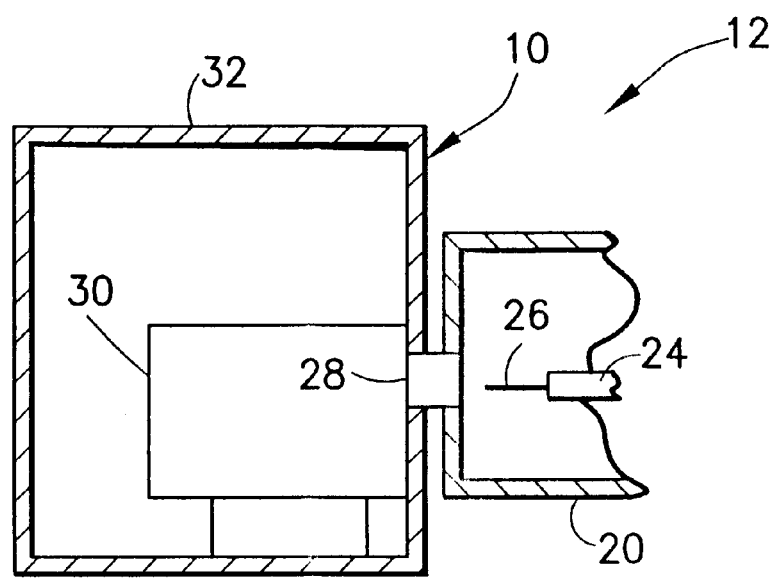
FIG. 2 is a schematic partial cross-sectional view of the substrate heating apparatus, shown in FIG. 1, connected to a central, transport chamber.

With reference to FIGS. 1 and 2, the substrate transport apparatus 14 generally comprises a substrate transport robot 22 having a driver section (not shown) and a movable arm section 24. The movable arm section 24 has an end effector 26 suitably sized to support the substrate during transport into and out of the processing chambers 16, the load locks 18 and the substrate heating apparatus 10. In alternate embodiments, any suitable type of substrate transport apparatus could be used. The transport apparatus 14, processing chambers 16 and load locks 18 are well known in the art and, thus, are not described in further detail.

Preferably, the substrate heating apparatus 10 includes a substrate heating assembly 30 and a housing 32. The substrate heating assembly 30 and the housing 32 are coupled to the central, transport chamber 20. Preferably, the substrate heating assembly 30 is located within the housing 32. The housing 32 insulates the substrate heating assembly 30 from environmental conditions surrounding the substrate processing apparatus 12. In an alternate embodiment, the housing 32 need not be included. Preferably, a slot valve or transport interface 28 is located between the substrate heating apparatus 10 and the central, transport chamber 20. The interface 28 seals off the substrate heating apparatus 10 from the central, transport chamber 20. In an operating mode, the movable arm section 24 of the substrate transport robot 22 transports the substrate through the interface 28 into the substrate heating assembly 30. The substrate heating apparatus 10 is preferably used as a pre-heat and degas module of the substrate processing apparatus 12.

Figure 3:
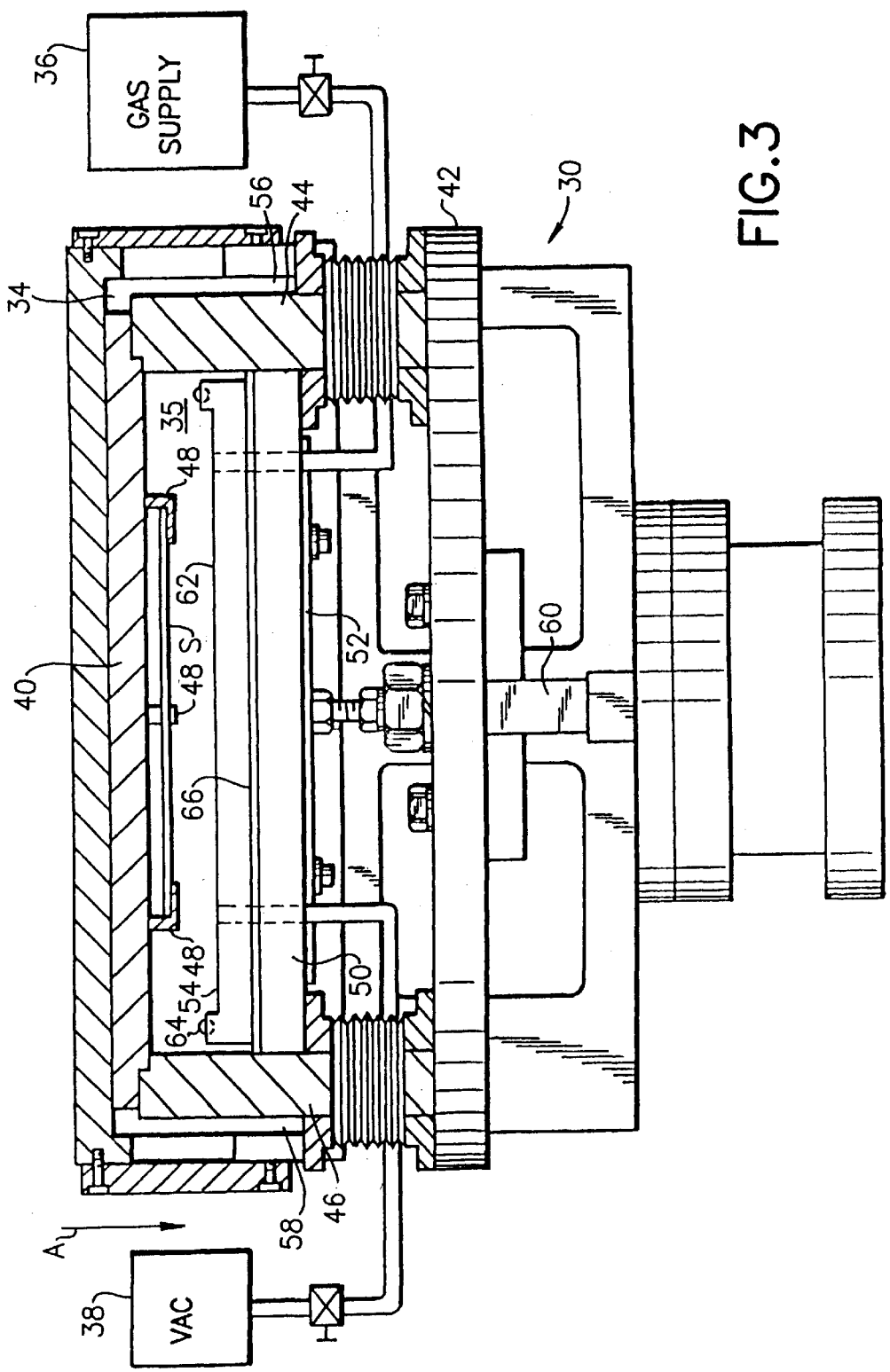
FIG. 3 is a schematic partial cross-sectional view of the substrate heating apparatus shown in FIG. 2.

In FIG. 3 the substrate heating assembly 30 is shown. The substrate heating assembly 30 generally includes a chamber 34, a gas supply 36 and a source of a vacuum 38. An example of a substrate heating assembly can be seen in commonly assigned U.S. Pat. No. : 5,588,827 which is hereby incorporated by reference in its entirety. The chamber 34 includes a substrate receiving area 35 adapted to receive a substrate being transported by the substrate transport robot 22 through the interface 28 into the substrate heating assembly 30. The substrate heating assembly 30 further includes a top plate 40 connected to a bottom plate 42 by two columns 44 and 46. The top plate 40 includes supports 48 for holding the substrate S which is loaded into and removed from the substrate receiving area 35 by the substrate transport robot 22. The supports 48 extend down from the top plate 40.

A thermal assembly 50 forms a bottom portion of the chamber 34. The thermal assembly 50 generally includes a base plate 52, a heater element 66 and a heater plate 54. The heater plate 54 is connected on top of the base plate 52 with the heater element 66 located therebetween. The configuration of the thermal assembly 50 is discussed in greater detail below. The base plate 52 has two holes 56 and 58 with the columns 44 and 46 located therein. A vertical drive mechanism 60 is connected to the bottom plate 42. The drive mechanism 60 is adapted to move the bottom plate 42 up and down relative to the chamber 34 and the heater plate 54. Because the columns 44 and 46 are connected to the bottom plate 42 and the top plate 40 is connected to the columns 44 and 46, the top plate 40 moves up and down with the bottom plate 42.

To achieve a closed position of the substrate heating assembly 30, the drive mechanism 60 moves the top plate 40 down toward a top surface 62 of the heater plate 54. In FIG. 3, which shows the substrate heating assembly 30 in an open position, the movement toward the closed position is in a direction indicated by arrow A. Around the perimeter of the top surface 62 of the heater plate 54 is a seal 64. The seal 64 contacts the top plate 40 as it moves into the closed position to form a seal between the top plate 40 and the top surface 62 of the heater plate 54. In the sealed and closed position, the top plate 40 and the heater plate 54 define a sub-enclosure within the substrate receiving area 35. The substrate is located within the sub-enclosure. The sub-enclosure forms an area in which substrate heating operations occur. The substrate heating operations are discussed in greater detail below. Preferably, the sub-enclosure is surrounded by reflective heat shields (not shown).

Figure 4:
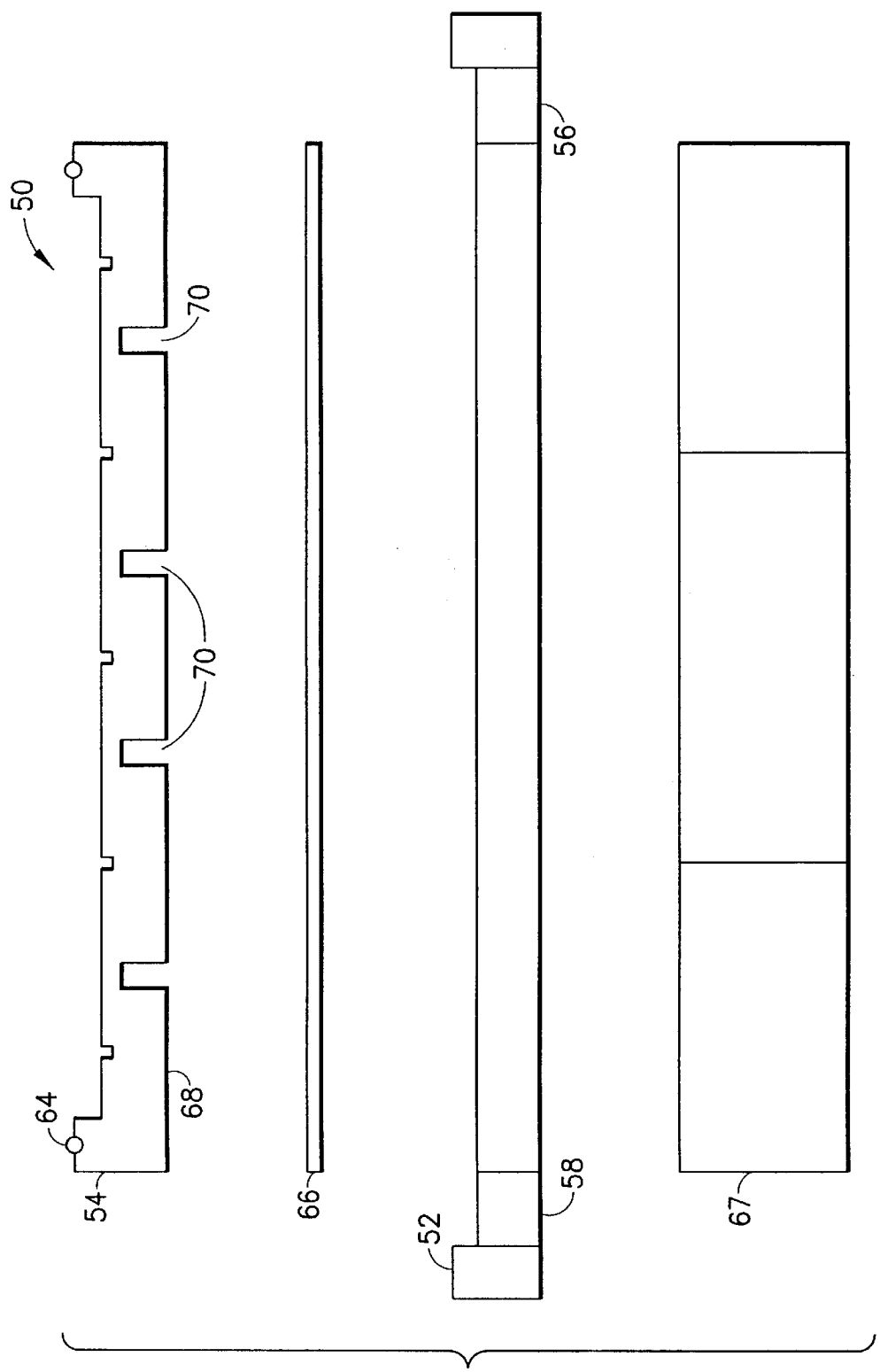
FIG. 4 is a schematic partial cross-sectional, exploded view of a substrate heating assembly shown in FIG. 3.

In FIG. 4 an exploded view of the thermal assembly 50 is shown. As noted above, the thermal assembly 50 includes the base plate 52, the heater element 66 and the heater plate 54. In one embodiment, the base plate 52 is comprised of a material that is a thermal and electrical insulator. In a preferred embodiment, the heater element 66 is sandwiched between a bottom surface 68 of the heater plate 54 and the base plate 52. In one embodiment, the sandwiched configuration of the thermal assembly 50 is retained by a retaining ring. An insulation element 67 can also be provided. Heat generated by the heater element 66 is conducted directly to the heater plate 54. In an operating mode, the thermal assembly 50 is in the sealed and closed position. In the sealed and closed position the substrate, located in the sub-enclosure, is in close proximity to the heater plate 54. Thus, during the operating mode the heater plate 54 transfers heat to the substrate. As noted above, the substrate heating operations are discussed in greater detail below. The heater plate 54 can be comprised of ceramic material with high transmissivity to accommodate for variable power density of the heating element to act as directly as possible on the substrate. The heater plate 54 could also be comprised of composite layered materials. For example, the plate 54 could have a main body comprised of material for high thermal capacitance to provide stable control, and the plate could have a surface comprised of material for high emissivity to maximize a radiative mode of heat transfer. The heater plate surface can be bead-blasted or engraved with shallow and thin grooves to maximize the effective surface area so as to enhance the radiative mode of heat transfer, and to increase the gas conductive heat transfer coefficient when the gas is introduced into the chamber.

Figure 8:
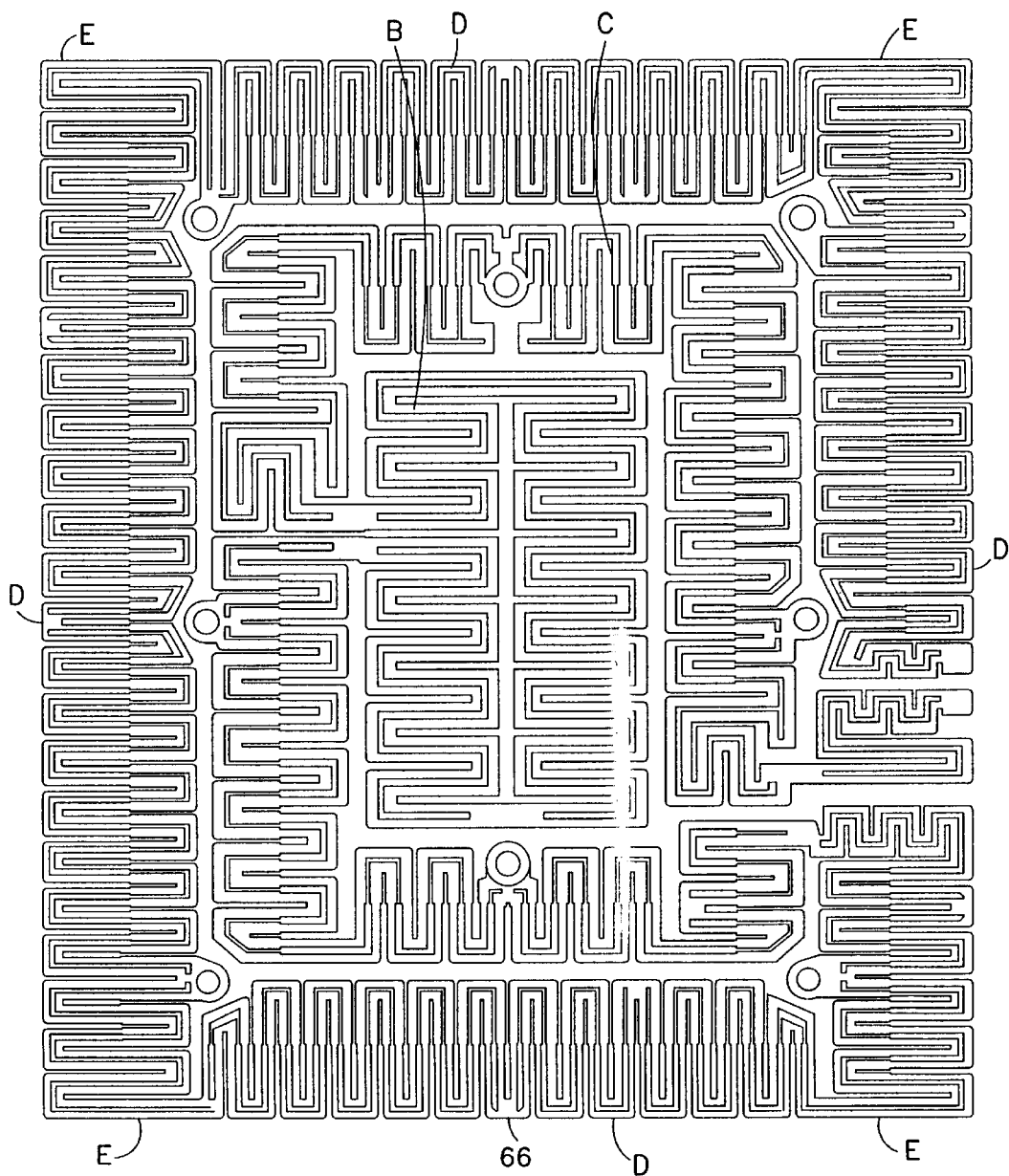
FIG. 8 is a schematic top view of a heater element of the substrate heating assembly shown in FIGS. 3 and 4.

Preferably, the heater element 66 is a thin film flat ribbon heater. An example of a thin film ribbon heater element can be found in commonly assigned, copending application Ser. No.: 08/882,367, which is hereby incorporated by reference in its entirety. The ribbon heater 66, shown in FIG. 8, is comprised of an electrically conductive metal with a thickness of about 0.004–0.005 of an inch. A non-uniform pattern of serpentine looped sections, shown in FIG. 8, has been designed to provide a plurality of distinct and different heat generation zones. The plurality of distinct and different heat generation zones, labeled zones B–E in FIG. 8, each provide a different level of heat generation. That is, the width of the metal in the strips that form the serpentine loops and the spacing between adjacent metal strips has been selected to provide different power density zones of heat generation.

By example, a center zone B has relatively wide strips and relatively wide spacing between adjacent strips. An intermediate zone C, which surrounds the center zone B, has varying strip width and spacing. By design, the thinner the strip width the greater the electrical resistance. Thus, the thinner strip width results in greater heat generation than wider strip width. The outer loop has side zones D and corner zones E. The corner zones E have the smallest width strips because heat loss will be the greatest at the corners of the heater. In general, the configuration of the ribbon heater 66 generates more heat at the outer most zones and less at the inner zones. While other variations of the heat pattern could be provided, an object of the plurality of distinct and different heat generation zones is to permit a heating of the substrate which results in the substrate increasing its temperature substantially uniformly across its surface. That is, the object of the heater pattern is to provide varying temperatures at an inner region and an outer region of the substrate that enable an increase in the temperature across the substrate in a substantially uniform manner. Therefore, it can be appreciated that alternate embodiments may include heater elements 66 having various heating patterns to heat the substrate. The various heating patterns, however, are configured to accomplish the objective of heating the substrate in the substantially uniform manner.

Figure 7A:
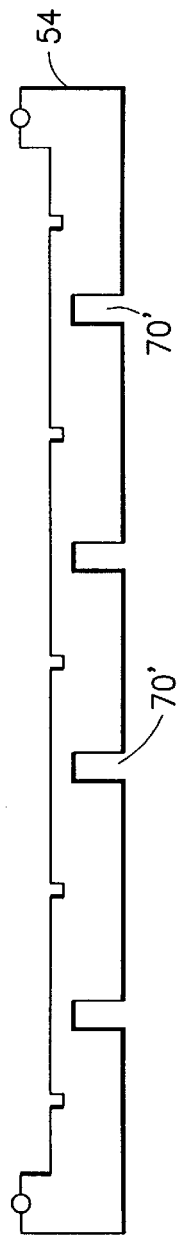
FIGS. 7a is a schematic cross-sectional view of a second embodiment of the heater plate.
Figure 7B:
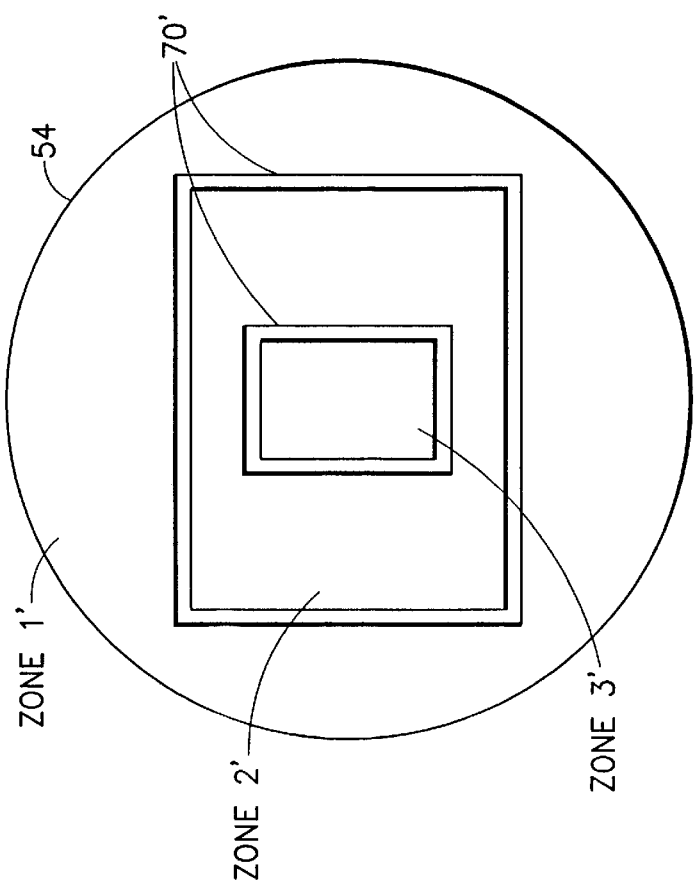

As shown in FIG. 4, the heater plate 54 is also configured to facilitate the heating of the substrate such that the substrate increases its temperature substantially uniformly across its surface. In particular, the bottom surface 68 of the heater plate 54 has at least one groove 70. The at least one groove 70 forms separate thermal zones on the heater plate 54. Preferably, the at least one groove 70 includes a plurality of grooves. In one embodiment, shown in FIG. 6, the plurality of grooves 70 are a plurality of concentric rings. In another embodiment, shown in FIGS. 7a and 7b, the plurality of grooves 70 are a plurality of elongated grooves 70'.

Referring to FIG. 5, the at least one groove 70 is preferably configured to be of a depth of about two-thirds (⅔) of a thickness of the heater plate 54. That is, where the heater plate 54 is a thickness of, by example, a dimension "x", a depth of a first groove 70a is about "⅔ x". In one embodiment, the heater plate 54 is a thickness of about 0.500 of an inch, while the depth of each of the plurality of grooves is about 0.375 of an inch. The first groove 70a thus divides the illustrated portion of the bottom surface 68 into a first and a second thermal zone, zone 1 and zone 2 respectively. The remaining thickness of the heater plate 54 above the first groove 70a defines a choke point 72. The choke point 72 substantially impedes the transfer of heat between zone 1 and zone 2. In alternate embodiments, the depth of the at least one groove 70 may be greater or less than the depth of about two-thirds (⅔) of the thickness of the heater plate 54. In accordance with the present invention the depth of the at least one groove 70 may vary as long as the choke point 72 substantially impedes the transfer of heat between the separate thermal zones of the heater plate 54.

Accordingly, if a first temperature of heat is provided by the ribbon heater 66 from one of its plurality of distinct and different heat generation zones to zone 1 on the bottom surface 68 of the heater plate 54 while a second temperature of heat is provided to zone 2, then in accordance with the present invention, the first groove 70a and the choke point 72 cooperate to impede the first temperature from substantially varying the second temperature as the heater plate 54 transfers heat from its bottom surface 68 to the substrate.

When disposed in the sandwiched configuration of the heater plate 54, the ribbon heater 66 and the base plate 52 discussed above, the separate thermal zones of the heater plate 54 and the plurality of distinct and different heat generation zones of the ribbon heater 66 cooperate to provide zones in which different rates of heat transfer between the heater plate 54 and the substrate. Referring briefly to FIGS. 6 and 8, it can be appreciated that, in the sandwiched configuration, the thermal zones 1, 2 and 3 of the heater plate 54 and the heat generation zones B, C, D and E of the ribbon heater 66 are aligned to produce, for example, three different rates of heat transfer between the heater plate 54 and the substrate. That is, the thermal zone 1 and the heat generation zones D and E are aligned to produce a first heat transfer rate, the thermal zone 2 and the heat generation zone C are aligned to produce a second heat transfer rate, and the thermal zone 3 and the heat generation zone B are aligned to produce a third heat transfer rate. As noted above, the first, the second and the third heat transfer rates are transferred from the heater plate 54 to the substrate. It can be appreciated that in alternate embodiments the alignment of the separate thermal zones of the heater plate 54 and the plurality of distinct and different heat generation zones of the ribbon heater 66 cooperate to provide at least two zones in which different rates of heat transfer between the heater plate 54 and the substrate.

In accordance with one embodiment of the present invention, the heater plate 54 is comprised of a material having high emissivity, high thermal conductivity, high thermal mass and non-electrical conductivity. Preferably, the heater plate 54 is comprised of aluminum nitride. In alternate embodiments, the heater plate 54 is comprised of other materials.

In one embodiment, again referring to FIG. 5, the heater plate 54 further comprises a top surface 74. The top surface 74 has a plurality of grooves 76. The plurality of grooves 76 are provided to distribute gas throughout the sub-enclosure within the substrate receiving area 35. In an alternate embodiment, the plurality of grooves 76 need not be included. The gas is provided within the sub-enclosure during gas conduction heating of the substrate. The gas conduction heating process is discussed in detail below. An example of the plurality of grooves to distribute gas throughout the sub-enclosure can be seen in the above-incorporated, commonly assigned U.S. Pat. No. : 5,588,827. It should be understood that features of the present invention could be used in any shape heat transfer plate for heating or cooling any shape flat substrate, such as round semiconductor wafers or square/rectangular flat panel substrates.

As noted above, the substrate heating operations are performed when the substrate heating assembly 30 is in the sealed and closed position. Prior to closing, the substrate has been placed into the substrate heating assembly 30 by the substrate transport apparatus 14. In a preferred embodiment, the movable arm section 24 of the substrate transport robot 22 is manipulated to transport the substrate through the interface 28 between the substrate heating apparatus 10 and the central, transport chamber 20. The substrate transport robot 22 loads the substrate into the substrate receiving area 35 of the substrate heating assembly 30. The substrate heating assembly 30 is then manipulated to its sealed and closed position. As noted above, in the sealed and closed position the sub-enclosure is formed within the substrate receiving area 35.

In a first method for heating a substrate in a substrate heating apparatus 10, the following steps are performed. As discussed above, the substrate is positioned in a chamber of the substrate heating apparatus 10. In a preferred embodiment, the chamber is the sub-enclosure portion of the substrate receiving area 35. In the sealed and closed position of the substrate heating assembly 30 the substrate is located above the thermal assembly 50. Thus, the substrate is located above a heat generating source, i.e. a heater. The heater is comprised of a top plate having a bottom surface. The bottom surface of the heater has at least one groove which divides the top plate into at least two thermal zones. Preferably, the top plate is the heater plate 54 of the thermal assembly 50.

Next the substrate is heated from the at least two thermal zones of the top plate. According to the first substrate heating method, the substrate is first heated only by radiation heating from the separate thermal zones of the top plate. However, after the substrate has obtained a predetermined temperature from the radiation heating, gas is added into the chamber. The gas is distributed throughout the chamber such that heat is transferred from the at least two thermal zones of the top plate to the substrate by gas conduction.

In a preferred embodiment of the first substrate heating method, the gas is distributed by grooves in a top surface of the top plate. That is, the gas is distributed by the grooves 76 in the top surface 74 of the heater plate 54 of the thermal assembly 50. Preferably, the gas is an inert gas, such as argon. The inert gas is supplied to the sub-enclosure of the substrate receiving area 35 by the gas supply 36.

In a second method for heating a substrate in a substrate heating apparatus 10, the following steps are performed. The substrate is positioned in a chamber of the substrate heating apparatus 10 in close proximity to a heater. Next, gas is added into the chamber such that heat is transferred from the heater to the substrate by gas conduction. Preferably, an inert gas is supplied to the sub-enclosure of the substrate receiving area 35 by the gas supply 36.

At a predetermined point in the heating of the substrate, the gas is removed from the chamber. Preferably, a vacuum source 38 evacuates the gas from the sub-enclosure of the substrate receiving area 35. The substrate is then maintained at a predetermined temperature only from the heat radiated from the heater. In one embodiment the predetermined point in the second method of heating the substrate is a point in which a predetermined temperature is measured in the chamber. Alternatively, the predetermined point in the heating of the substrate can be a point in which a predetermined time period, measured from the start of the second heating method, elapses.

In a third method for heating a substrate in a substrate heating apparatus 10, the following steps are performed. The substrate is positioned in a chamber of the substrate heating apparatus 10 in close proximity to a heater. Gas is added into the chamber for transferring heat between the substrate and the heater by gas conduction. In the third heating method, the rate at which gas is added into the chamber is controlled. That is, gas is gradually added into the chamber in a controlled fashion. By gradually adding gas into the chamber in the controlled fashion, a heat transfer rate between the substrate and the heater is gradually increased. In other words, the rate of heat transferred by gas conduction between the substrate and the heater is gradually increased as more gas is added into the chamber.

Although described in the context of preferred embodiments, it should be realized that a number of modifications to these teachings may occur to one skilled in the art. By example, and as discussed above, the teachings of this invention are not intended to be limited to any specific substrate heating process.

While the invention has been particularly shown and described with respect to preferred embodiments thereof, it will be understood by those skilled in the art that changes in form and details may be made therein without departing from the scope and spirit of the invention.

What is claimed is:

1. A substrate heating apparatus for heating a substrate, comprising:
   a chamber; and
   a substrate heater disposed in said chamber, said substrate heater comprising:
      a first plate having a bottom surface with at least one groove along said bottom surface, said first plate forming at least two individual thermal zones at least partially insulated from each other by said at least one groove, wherein said at least one groove forms an insulating boundary between said at least two thermal zones extending into said first plate from said bottom surface;
      a heater element; and
      a second plate;
      wherein said heater element is disposed between said bottom surface of said first plate and said second plate for heating said substrate.

2. A substrate heating apparatus as set forth in claim 1, wherein said first plate is comprised of a material having high emissivity, high thermal conductivity, high thermal mass and non-electrical conductivity.

3. A substrate heating apparatus as set forth in claim 2, wherein said material is comprised of aluminum nitride.

4. A substrate heating apparatus as set forth in claim 1, wherein said first plate is about 0.500 inches thick, and said at least one groove is about 0.375 inches deep.

5. A substrate heating apparatus as set forth in claim 1, wherein said at least one groove is comprised of a plurality of grooves which form a plurality of thermal zones on said first plate.

6. A substrate heating apparatus as set forth in claim 5, wherein said plurality of grooves are comprised of a plurality of concentric rings.

7. A substrate heating apparatus as set forth in claim 5, wherein said plurality of grooves are comprised of a plurality of elongated grooves.

8. A substrate heating apparatus as set forth in claim 1, wherein said first plate further comprises a top surface, said top surface having grooves therealong to distribute gas during gas conduction heating.

9. A substrate heating apparatus as set forth in claim 1, wherein said heater element is comprised of a thin film ribbon heater element having a plurality of distinct and different heat generation zones, said plurality of distinct and different heat generation zones providing different levels of power density per unit area and, thus, different levels of heat generation.

10. A substrate heating apparatus as set forth in claim 1, wherein said second plate is comprised of a material that is a thermal and electrical insulator.

11. A substrate heating apparatus as set forth in claim 1, wherein said heater element is sandwiched directly between said bottom surface of said first plate and said second plate.

12. A substrate heating apparatus as set forth in claim 11, wherein said sandwiched configuration is retained by a retaining ring.

13. A substrate heater for heating a substrate, comprising:
- a heater plate having a rear surface with at least one groove, said at least one groove being configured to divide said heater plate into at least two separate thermal zones; and
- a heater element having a plurality of distinct and different heat generation zones, said plurality of distinct and different heat generation zones providing different levels of heat generation;
- wherein said heater plate is disposed in close proximity to said heater element such that said at least two separate thermal zones of said heater plate and said plurality of distinct and different heat generation zones of said heater element cooperate to provide zones in which different rates of heat transfer between said heater plate and said substrate, and wherein said substrate increases its temperature substantially uniformly across a surface of the substrate.

14. A substrate heater as set forth in claim 13, wherein said heater plate is comprised of a material having high emissivity, high thermal conductivity, high thermal mass and non-electrical conductivity.

15. A substrate heater as set forth in claim 13, wherein a depth of said at least one groove is about two-thirds of a thickness of said heater plate.

16. A substrate heater as set forth in claim 13, wherein said heater plate further comprises a front surface opposite said rear surface with said at least one groove configured to form said at least two separate thermal zones, said opposite front surface having grooves therealong to distribute gas during gas conduction heating.

17. A method for heating a substrate in a substrate heating apparatus, the method comprising the steps of:
- positioning the substrate in a chamber of the substrate heating apparatus above a heater, the heater is comprised of a top plate having a bottom surface, the bottom surface having at least one groove which forms at least two thermal zones;
- heating the substrate from the at least two thermal zones of the top plate only by radiation heating; and
- after the substrate has obtained a predetermined temperature from the radiation heating, adding gas into the chamber such that heat is transferred from the at least two thermal zones of the top plate to the substrate by gas conduction.

18. A method for heating a substrate in a substrate heating apparatus, the method comprising the steps of:
- positioning the substrate in a chamber of the substrate heating apparatus in close proximity to a heater;
- heating the substrate from heat radiated from the heater;
- after the substrate has been heated by radiated heat to a predetermined condition, adding gas into the chamber such that heat is transferred from the heater to the substrate by gas conduction;
- at a predetermined point in the heating of the substrate, removing the gas from the chamber; and
- maintaining the substrate at a predetermined temperature only from the radiation heating radiated from the heater.

19. A method for heating a substrate as set forth in claim 18, wherein the predetermined point in the heating of the substrate is a point in which a predetermined temperature is measured in the chamber.

20. A method for heating a substrate as set forth in claim 18, wherein the predetermined point in the heating of the substrate is a point in which a predetermined time period, measured from the start of the heating, elapses.

21. A method for heating a substrate in a substrate heating apparatus, the method comprising the steps of:
- positioning the substrate in a chamber of the substrate heating apparatus in close proximity to a heater;
- heating the substrate from heat radiated from the heater;
- adding gas into the chamber for transferring heat between the substrate and the heater by gas conduction; and
- controlling a rate of heat transfer by gas conduction of heat from the heater to the substrate during the step of adding gas into the chamber by controlling a rate of gas addition into the chamber,
- wherein the step of controlling the rate of gas addition adds the gas gradually into the chamber wherein a heat transfer rate between the substrate and the heater is increased gradually as more gas is added into the chamber.

* * * * *